(12) United States Patent
Joo

(10) Patent No.: US 7,701,766 B2
(45) Date of Patent: Apr. 20, 2010

(54) NON-VOLATILE MEMORY DEVICE AND METHOD OF PROGRAMMING IN THE SAME

(75) Inventor: Byoung-In Joo, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 183 days.

(21) Appl. No.: 11/949,650

(22) Filed: Dec. 3, 2007

(65) Prior Publication Data

US 2008/0266961 A1  Oct. 30, 2008

(30) Foreign Application Priority Data

Apr. 25, 2007  (KR) ...................... 10-2007-0040297

(51) Int. Cl.
*G11C 16/06* (2006.01)
(52) U.S. Cl. .............................. 365/185.12; 365/189.05; 365/189.17; 365/191
(58) Field of Classification Search ............ 365/185.12, 365/189.05, 189.17, 191
See application file for complete search history.

(56) References Cited

U.S. PATENT DOCUMENTS

| 7,515,483 | B2 * | 4/2009 | Han | ...................... | 365/189.05 |
|---|---|---|---|---|---|
| 2005/0232025 | A1 * | 10/2005 | Ju | ...................... | 365/189.05 |
| 2005/0257120 | A1 | 11/2005 | Gorobets et al. | | |
| 2006/0114723 | A1 * | 6/2006 | Ju | ...................... | 365/185.22 |
| 2006/0209601 | A1 * | 9/2006 | Kim | ...................... | 365/189.05 |
| 2007/0064485 | A1 * | 3/2007 | Han | ...................... | 365/185.12 |

FOREIGN PATENT DOCUMENTS

KR  1020070105141 A  10/2007

* cited by examiner

*Primary Examiner*—Thong Q Le
(74) *Attorney, Agent, or Firm*—Townsend and Townsend and Crew LLP

(57) ABSTRACT

A non-volatile memory device according to one example embodiment of the present invention includes a page buffer configured to have a first register for receiving data and storing temporarily the received data to be inputted to a pair of first bit lines, a second register coupled selectively to the first register and for storing temporarily data to be inputted to a pair of second bit lines, and a third register for storing temporarily specific data in accordance with a level of the data stored in the first register; a first bit line selecting circuit configured to couple selectively a given bit line of the first bit lines to the first register; and a second bit line selecting circuit configured to couple selectively a certain bit line of the second bit lines to the second register.

21 Claims, 4 Drawing Sheets

NON-VOLATILE MEMORY DEVICE AND METHOD OF PROGRAMMING IN THE SAME

CROSS-REFERENCE TO RELATED APPLICATIONS

This application claims priority from Korean Patent Application No. 2007-40297, filed on Apr. 25, 2007, the contents of which are incorporated herein by reference in its entirety.

Background of the Invention

The present invention relates to a non-volatile memory device having an improved page buffer and a method of programming the same.

Recently, the demand has increased for a semiconductor memory device which electrically programs and erases data, and does not require a refresh function for periodically rewriting data.

The non-volatile memory device includes a memory cell array having cells for storing data with a matrix shape, and a page buffer for programming data to specific cells of the memory cell array and reading data from a cell.

The page buffer has a pair of bit lines coupled to a memory cell, a register for temporarily storing data to be programmed to the memory cell array and temporarily storing data read from a specific cell, a sensing node for sensing a voltage of a bit line or a register, and a bit line selecting circuit for controlling a coupling of the specific bit line and the sensing node.

Generally, the non-volatile memory device performs a program operation and a read operation, etc. using two registers each coupled to a pair of bit lines.

However, in the case that the non-volatile memory device maintains a structure of the above page buffer, it is difficult for the non-volatile memory device to employ a bit line array which becomes smaller as an area of the page buffer is reduced. Accordingly, a new page buffer for reducing an area while maintaining a time for the program operation has been required.

SUMMARY OF THE INVENTION

It is a feature of the present invention to provide a non-volatile memory device having an improved page buffer and a method of programming the same.

A page buffer in a non-volatile memory device according to one example embodiment of the present invention includes a first register configured to receive data and store temporarily the data to be inputted to a pair of first bit lines; a second register coupled selectively to the first register, and configured to store data to be inputted to a pair of second bit lines; and a third register configured to store temporarily given data in accordance with a level of the data stored in the first register.

A non-volatile memory device according to one example embodiment of the present invention includes a page buffer configured to have a first register for receiving data and storing temporarily the received data to be inputted to a pair of first bit lines, a second register coupled selectively to the first register and for storing temporarily data to be inputted to a pair of second bit lines, and a third register for storing temporarily specific data in accordance with a level of the data stored in the first register; a first bit line selecting circuit configured to couple selectively a given bit line of the first bit lines to the first register; and a second bit line selecting circuit configured to couple selectively a certain bit line of the second bit lines to the second register.

A method of programming in a non-volatile memory device having a first to third registers for storing temporarily data to be inputted to a pair of first bit lines and a pair of second bit lines according to one example embodiment of the present invention includes receiving data to be inputted to a given bit line of the second bit lines through an outside data inputting circuit, and storing the received data in the first register and the second register; receiving data to be inputted to a given bit line of the first bit lines through the outside data inputting circuit, and storing the received data in the first register; transmitting the data in the first register to a specific bit line of the first bit lines, and transmitting the data in the second register to a specific bit line of the second bit lines; and programming whole pages in accordance with the data transmitted to the specific bit line.

As described above, a non-volatile memory device of the present invention performs a program operation using only three registers about four bit lines, unlike the common non-volatile memory device using fourth registers about four bit lines. As a result, the number of elements in the page buffer is reduced, and so an integration of a chip having the non-volatile memory device may be enhanced.

DESCRIPTION OF SPECIFIC EMBODIMENTS

Hereinafter, the embodiments of the present invention will be explained in more detail with reference to the accompanying drawings.

Figure 1:
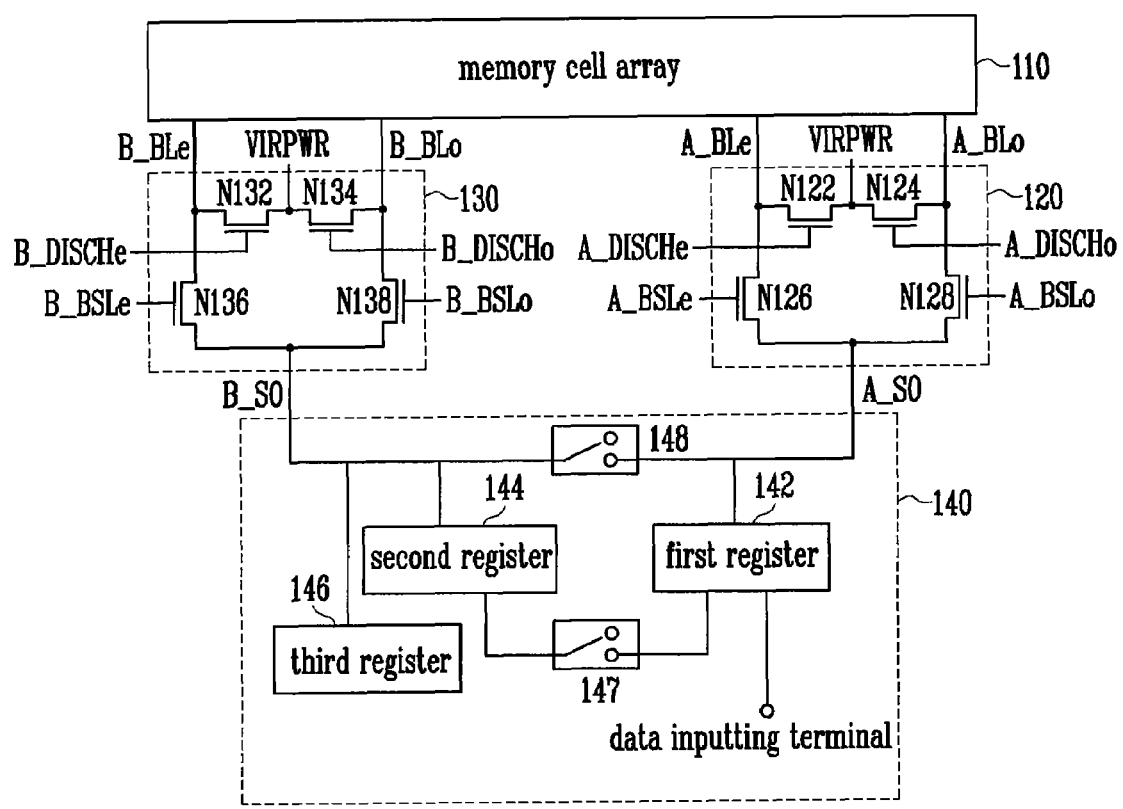
FIG. 1 is a view illustrating a non-volatile memory device having an improved page buffer according to one example embodiment of the present invention.

FIG. 1 is a view illustrating a non-volatile memory device having an improved page buffer according to one example embodiment of the present invention.

The non-volatile memory device 100 of the present embodiment includes a memory cell array 110, a first bit line selecting circuit 120 for selecting one of a pair of first bit lines A_BLe or A_BLo, a second bit line selecting circuit 130 for selecting one of a pair of second bit lines B_BLe or B_BLo, and a page buffer 140 for temporarily storing data to be programmed to the memory cell array 110 through each of the bit line selecting circuits 120 and 130 or temporarily storing data to be read from the memory cell array 110 through the each of the bit line selecting circuits 120 and 130.

The first bit line selecting circuit 120 has an NMOS transistor N126 for coupling the first even bit line A_BLe to a first sensing node A_SO in response to a first even bit line selecting signal A_BSLe, and an NMOS transistor N128 for coupling the first odd bit line A_BLo to the first sensing node A_SO in response to a first odd bit line selecting signal A_BSLo.

The first bit line selecting circuit 120 also includes a control signal inputting terminal for providing a control signal VIR- PWR having a given level, an NMOS transistor N122 for coupling the first even bit line A_BLe to the control signal inputting terminal in response to a first even discharge signal A_DISCHe, and an NMOS transistor N124 for coupling the first odd bit line A_BLo to the control signal inputting terminal in response to a first odd discharge signal A_DISCHo.

In one example embodiment of the present invention, specific data stored in a first register 142 are transmitted to the first bit lines A_BLe and A_BLo through the first bit line selecting circuit 120.

The second bit line selecting circuit 130 has an NMOS transistor N136 for coupling the second even bit line B_BLe to a second sensing node B_SO in response to a second even bit line selecting signal B_BSLe, and an NMOS transistor N138 for coupling the second odd bit line B_BLo to the second sensing node B_SO in response to a second odd bit line selecting signal B_BSLo.

The second bit line selecting circuit 130 also includes a control signal inputting terminal for providing a control signal VIRPWR having a specific level, an NMOS transistor N132 for coupling the second even bit line B_BLe to the control signal inputting terminal in response to a second even discharge signal B_DISCHe, and an NMOS transistor N134 for coupling the second odd bit line B_BLo to the control signal inputting terminal in response to a second odd discharge signal B_DISCHo.

In one example embodiment of the present invention, specific data stored in a second register 144 are transmitted to the second bit lines B_BLe and B_BLo through the second bit line selecting circuit 130.

The page buffer 140 includes the first register 142 for storing temporarily data to be inputted to the first bit lines A_BLe and A_BLo, the second register 144 for temporarily storing data to be inputted to the second bit lines B_BLe and B_BLo, and a third register 146 for temporarily storing specific data in accordance with a level of data stored in the first register 142.

That is, the non-volatile memory device of the present embodiment uses only three registers 142, 144 and 146 with the four bit lines A_BLe, A_BLo, B_BLe and B_BLo unlike the non-volatile memory device in Related Art which uses four registers with four bit lines.

In a program operation, data are inputted through the first register 142 coupled to a data inputting terminal. In the case that the inputted data are provided to the second bit lines B_BLe and B_BLo, the second register 144 is coupled to the first register 142, and so the inputted data are stored in the second register 144. Then, the stored data are provided to the second bit lines B_BLe and B_BLo through the second bit line selecting circuit 130.

In addition, in the case that the inputted data are provided to the first bit lines A_BLe and A_BLo, the data are inputted to the first register 142 under the condition that the first register 142 is disconnected from the second register 144. Subsequently, the inputted data are provided to the first bit lines A_BLe and A_BLo through the first bit line selecting circuit 120.

The page buffer 140 further includes a first couple control means (or first couple control unit) 147 for controlling the connection (or coupling) of the first register 142 and the second register 144 during an input interval of an outside data. Additionally, the page buffer 140 further includes a second couple control means 148 (or second couple control unit) for controlling the connection (or coupling) of a certain register and corresponding bit line selecting circuit when data stored in the register are transmitted to the bit line selecting circuit.

That is, in the case that specific data are provided to the second bit lines B_BLe and B_BLo through the second register 144, the first couple control means 147 is turned on so that the second register 144 is coupled to the first register 142. Then, the data inputted through the data inputting terminal are provided to the second register 144. Subsequently, the second couple control means 148 is turned off, thereby providing the data stored in the second register 144 to only the second bit line selecting circuit 130.

In the case that specific data are provided to the first bit lines A_BLe and A_BLo, the first couple control means 147 is turned off so that the first register 142 is disconnected from the second register 144. As a result, the data inputted through the data inputting terminal are provided to only the first register 142. Then, the second couple control means 148 is turned off, thereby providing the data stored in the first register 142 to only the first bit line selecting circuit 120.

The third register 146 is used for storing comparison verifying data in a program verifying operation.

In other words, in the verifying operation of a specific cell coupled to the second bit lines B_BLe and B_BLo in accordance with data stored in the second register 144, data identical to the data stored in the second register 144 are stored in the third register 146, and then a first verifying operation is performed.

After the first verifying operation is finished, a second verifying operation for verifying program of a given cell coupled to the first bit lines A_BLe and A_BLo is performed. Subsequently, data identical to the data stored in the first register 142 are stored in the third register 146, and then the second verifying operation is performed.

Hereinafter, the structure and operation of the first to third registers 142, 144 and 146 will be described in detail.

Figure 2:
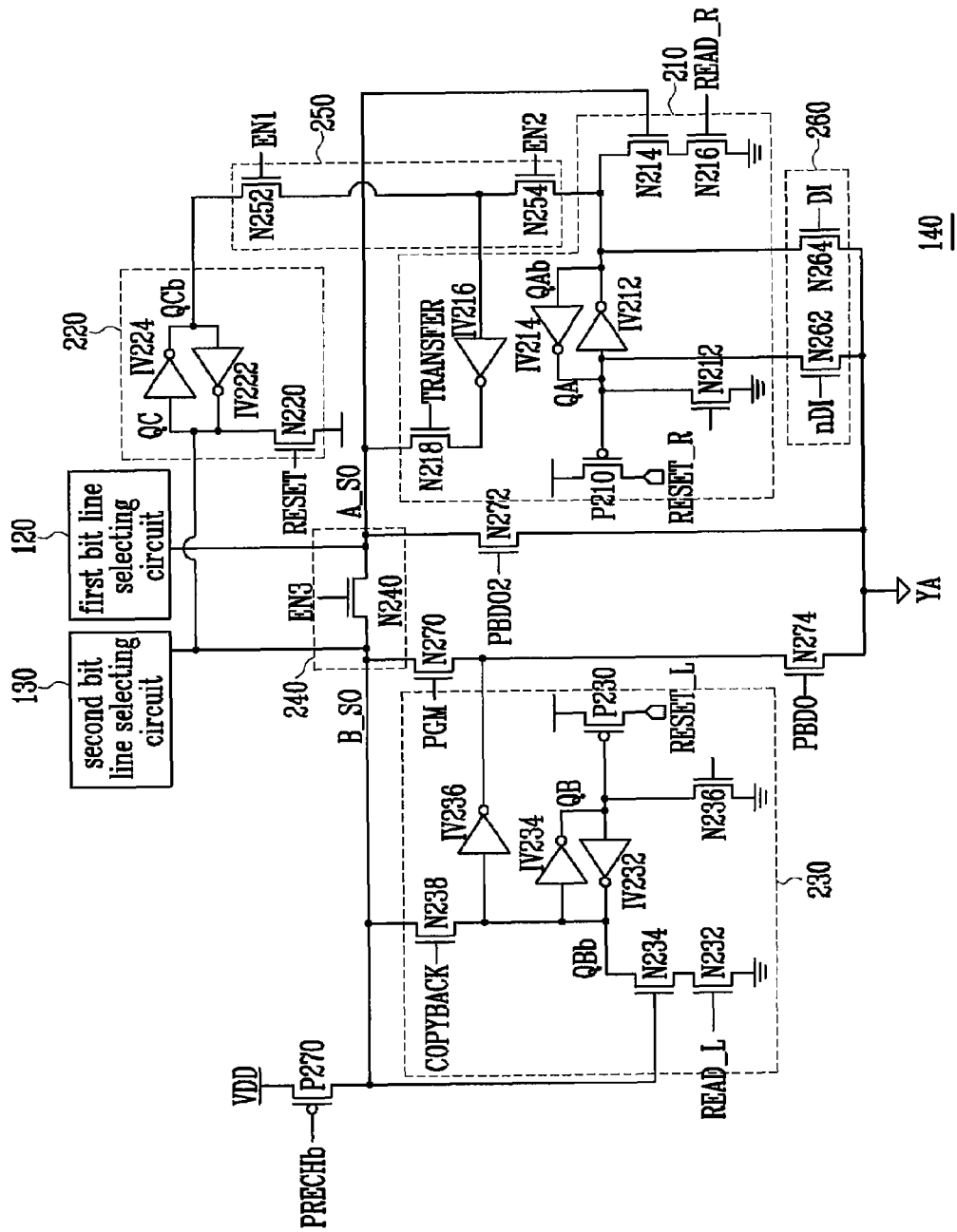
FIG. 2 is a view illustrating a circuitry of the page buffer according to one example embodiment of the present invention.

FIG. 2 is a view illustrating a circuitry of the page buffer according to one example embodiment of the present invention.

The page buffer 140 includes the sensing nodes A_SO and B_SO coupled to the bit line selecting circuits 120 and 130, a first to third registers 210, 220 and 230, a first and second couple control means 240 and 250, and a data inputting means 260.

The first register 210 includes a first latch having two inverters IV212 and IV214, a first NMOS transistor N212 coupled between a first node QA of the first latch and a ground voltage and turned on in response to a reset signal RESET_R, and a second and third NMOS transistors N216 and N214 coupled in series between a second node QAb of the first latch and the ground voltage. Here, the second NMOS transistor N216 is turned on in response to a read signal READ_R, and the third NMOS transistor N214 is turned on in response to a voltage level of the first sensing node A_SO.

Accordingly, a voltage having a high level is applied to the first sensing node A_SO in accordance with a voltage level of a given bit line. In the case that the read signal READ_R having a high level is applied to the second NMOS transistor N216, data having a low level are provided to the second node QAb.

The first couple control means 250 is coupled between a second node QCb of the second register 220 and the second node QAb of the first register 210, and so the coupling of the registers 210 and 220 is controlled by the first couple control means 250.

The first couple control means 250 includes an NMOS transistor N252 coupled between the second node QAb of the first register 210 and the second node QCb of the second register 220 and turned on in response to a first enable signal ENI.

In one example embodiment of the present invention, the first couple control means 250 may further include an NMOS transistor N254 coupled in series to the NMOS transistor N252. The first NMOS transistor N252 is turned on in response to the first enable signal EN1 and the second NMOS transistor N254 is turned on in response to a second enable signal EN2. In the case that the first couple control means 250 further includes the NMOS transistor N254, the first couple control means 250 may control more efficiently the couple between the registers 210 and 220.

In another example embodiment of the present invention, a PMOS transistor P210 for outputting a verifying finish signal in accordance with a voltage level of the first node QA may be coupled to the first node QA of the first register 210. In the case that a verifying operation is performed by using only the third register 230, the PMOS transistor P210 may not be used as described below. However, in case that a verifying operation about the first bit line is performed by using the first register 210, the PMOS transistor P210 is used.

In the case that a voltage having low level is applied to the first node QA, the PMOS transistor P210 is turned on, thereby outputting a signal having a high level through a verifying terminal (or verifying unit) nWDO. However, in the case that a voltage having a high level is applied to the first node QA, the verifying terminal nWDO is in a floating state. Accordingly, a signal is outputted through the verifying terminal nWDO, wherein the signal indicates whether or not the verifying operation is finished in accordance with a level of data stored in the first node QA.

The first register 210 includes also an inverter IV216 for inverting data stored in the second node QAb and transmitting the inverted data to the first sensing node A_SO, and an NMOS transistor N218 for providing the data transmitted through the inverter IV216 to the first sensing node A_SO in response to a data transmitting signal TRANSFER.

The first register 210 is coupled to a data inputting circuit 260 of the page buffer 140.

The data inputting circuit 260 selectively provides data having a low level to the first node QA or the second node QAb of the first register 210. To perform a function mentioned above, the data inputting circuit 260 includes an NMOS transistor N262 coupled between the first node QA and a data input/output terminal YA and turned on in response to a first data input signal nDI, and an NMOS transistor N264 coupled between the second node QAb and the data input/output terminal YA and turned on in response to a second data input signal DI having a level opposite to a level of the first data input signal nDI.

Accordingly, data having a low level are provided to the first node QA in case that the first data input signal nDI is transmitted, and data having a low level are provided to the second node QAb in case that the second data input signal DI is transmitted.

The second register 220 includes a second latch having two inverters IV222 and IV224, and a first NMOS transistor N220 coupled between the first node QC of the second latch and the ground voltage and turned on in response to a reset signal RESET. Accordingly, the first node QC is initialized to a low level in response to the reset signal RESET having a high level.

The first node QC is coupled to the second bit line selecting circuit 130.

The second node QCb of the second latch is coupled to the first register 210, wherein the couple of the second node QCb and the first register 210 are controlled by the first couple control means 147 or 250 as described in the embodiment in FIG. 1.

The third register 230 includes a third latch having two inverters IV232 and IV234, a first NMOS transistor N236 coupled between the first node QB of the third latch and the ground voltage and turned on in response to a reset signal RESET_L, and a second and third NMOS transistors N232 and N234 coupled in series between the second node QBb of the third latch and the ground voltage.

The second NMOS transistor N232 is turned on in response to a read signal READ_L, and the third NMOS transistor N234 is turned on in response to a voltage level of the second sensing node B_SO.

Accordingly, a voltage having a high level is applied to the second sensing node B_SO in accordance with a voltage level of a given bit line, and data having a low level are provided to the second node QBb in the case that the read signal READ_L having a high level is transmitted.

A PMOS transistor P230 for outputting a verifying finish signal in accordance with a voltage level of the first node QB is coupled to the first node QB of the third register 230. The PMOS transistor P230 outputs a signal having a high level through the verifying terminal nWDO when a voltage having a low level is applied to the first node QB. In the case that a voltage having a high level is applied to the first node QB, the verifying terminal nWDO is in a floating state. Accordingly, a signal is outputted through the verifying terminal nWDO, wherein the signal indicates whether or not the verifying operation is finished in accordance with a level of data stored in the first node QB.

The third register 230 includes also an NMOS transistor N238 for transmitting data stored in the second node QBb to the second sensing node B_SO in response to a copyback operation signal COPYBACK, and an inverter IV236 for inverting the data stored in the second node QBb and transmitting the inverted data in the program operation.

The second couple control means 148 and 240 controls a coupling of the first sensing node A_SO and the second sensing node B_SO.

The second couple control means 148 and 240 includes an NMOS transistor N240 coupled between the first sensing node A_SO and the second node B_SO and turned on in response to a third enable signal EN3. Accordingly, the coupling of the first sensing node A_SO and the second sensing node B_SO is determined in accordance with the third enable signal EN3.

Figure 3:
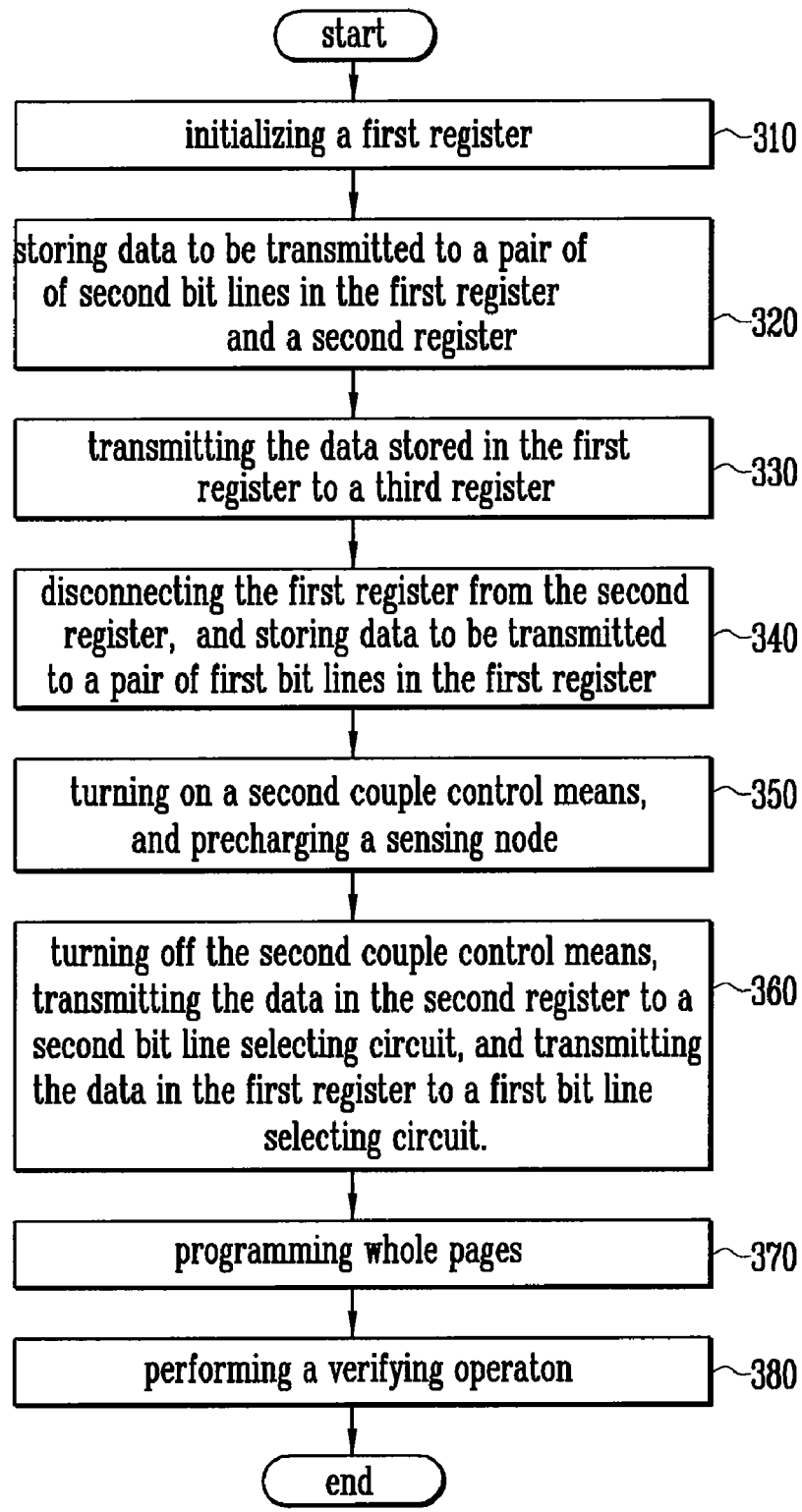
FIG. 3 is a flow chart illustrating a program operation in a non-volatile memory device according to one example embodiment of the present invention.

FIG. 3 is a flow chart illustrating a program operation in a non-volatile memory device according to one example embodiment of the present invention.

In step S310, the first register 210 is initialized before data are inputted through the first register 210 coupled to the data inputting circuit 260.

The first node QA is initialized to a low level by transmitting the reset signal RESET_R having a high level to the first register 210. On the other hand, the second node QAb is initialized to a low level by precharging the sensing node to a high level and transmitting the read signal READ_R having a high level.

In step S320, data to be transmitted to the second bit line are stored in the second register 220.

The first couple control means 250 may be turned on, thereby coupling the second register 220 to the first register 210. In addition, data are inputted through the data inputting circuit 260. Accordingly, data stored in the second node QAb of the first register 210 are transmitted to the second node QCb of the second register 220 and then the transmitted data are stored.

In another example embodiment of the present invention, the second register 220 may be initialized before the data are stored in the second register 220. To perform the initialization, the reset signal RESET having a high level is transmitted and data having a low level are stored in the first node QC of the second register 220.

In step S330, data stored in the first register 210 are transmitted to the third register 230.

This is an operation of transmitting and storing in advance the data stored in the second register 220 to the third register 230 before the verifying operation described below. Since the second register 220 does not have a transistor for sensing a level of the sensing node, the data stored in the second register 220 are transmitted to the third register 230, and then the verifying operation is performed. Here, since the data stored in the second register 220 are the same as in the first register 210, the data stored in the first register 210 are transmitted to the third register 230.

The second couple control means 240 and the transistor N218 may be turned on, thereby transmitting the data stored in the second node QAb of the first register 210 to the sensing node. In the embodiment where the first couple control means 240 has the second NMOS transistor N254, an operation of turning on the second NMOS transistor N254 is needed.

In addition, the data identical to the data stored in the first node QA of the first register 210 are stored in the first node QB of the third register 230 by transmitting the read signal READ_L having a high level.

In step S340, the first sensing node A_SO is disconnected from the second sensing node B_SO, data to be transmitted to the first bit line are stored in the first register 210.

It is desirable to turn off the first couple control means 250, thereby storing the outside data in only the first register 210.

An operation of inputting the outside data using the data inputting circuit 260 is similar to that in the step S320.

In step S350, the first sensing node A_SO and the second sensing node B_SO are precharged to a high level.

A precharge signal PRECHb having a low level may be transmitted to a gate of a PMOS transistor P270. Then, the second couple control means 240 is turned on, thereby precharging the first sensing node A_SO and the second sensing node B_SO to a high level.

In step S360, the first sensing node A_SO is disconnected from the second sensing node B_SO, data stored in the second register 220 are transmitted to the second bit line selecting circuit 130, and data stored in the first register 210 are transmitted to the first bit line selecting circuit 120.

It is desirable to turn off the second couple control means, thereby disconnecting the first sensing node A_SO from the second sensing node B_SO. Furthermore, the data stored in the first register 210 are transmitted to the first sensing node A_SO in response to the data transmitting signal TRANSFER.

A voltage level of each of the bit lines is varied in accordance with a level of the transmitted data.

In step S370, a program operation is performed on whole pages in accordance with the voltage applied to each of the bit lines in the step S360.

In the case that the voltage of each of the bit lines has a high level, a cell coupled to a corresponding bit line is set as a program prohibition cell. However, in the case that the voltage of each of the bit lines has a low level, a cell coupled to a corresponding bit line is set as a program cell to be programmed.

In step S380, a verifying operation for the program is performed.

Hereinafter, this verifying operation will be described in detail with reference to an accompanying drawing.

Figure 4:
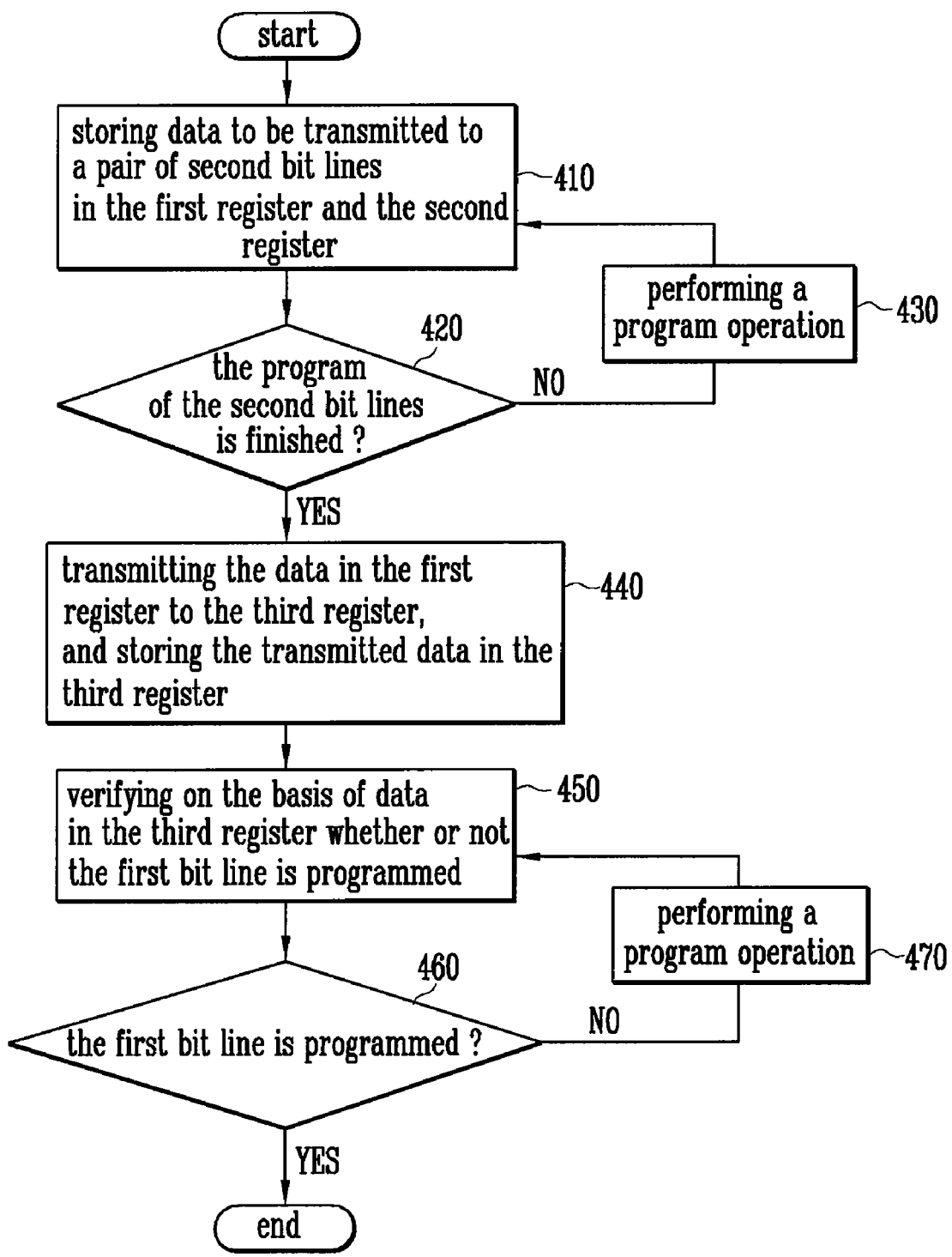
FIG. 4 is a flow chart illustrating a verifying operation in the non-volatile memory device according to one example embodiment of the present invention.

FIG. 4 is a flow chart illustrating a verifying operation in the non-volatile memory device according to one example embodiment of the present invention.

In step S410, a verifying operation for the program of cells coupled to the second bit line is performed.

To perform the verifying operation, the data stored in the second register 220 are stored in the third register 230. Accordingly, the verifying operation about the program is performed by using the third register 230.

Hereinafter, the verifying operation will be described in detail.

In the case that the data stored in the first node QB of the third register 230 are data having a low level, a corresponding cell is set as a program cell to be programmed. However, in the case that the data stored in the first node QB are data having a high level, a corresponding cell is set as an erase cell to be erased.

Then, in the case that the program operation and the verifying operation are performed, a voltage level of the bit line is varied in accordance with a result as to whether or not the cell is programmed. Additionally, a voltage level of the sensing node is varied in response to the voltage level of the bit line.

That is, in case that a threshold voltage of a specific cell is increased to a voltage more than a verifying voltage due to the program operation, the voltage of the sensing node maintains a high level. However, in case that a cell is not programmed as an erased cell or is not increased to a voltage more than the verifying voltage though the program operation is performed, the voltage of the sensing node is converted into a low level.

Accordingly, a state of the NMOS transistor N234 of the third register 230 turned on in accordance with the voltage level of the sensing node B_SO is varied.

In addition, in the case that the read signal READ_L having a high level is transmitted to the transistor N232, data stored in the first node QB are varied in accordance with a result as to whether or not a specific cell is programmed.

In the case that the cell is programmed, data having a high level are stored in the first node QB. In the case that the cell is not a program cell, the cell is not programmed. Hence, data having a high level initialized to the first node QB (data initialized in case of the erased cell) are maintained. Accordingly, the PMOS transistor P230 of the third register 230 is not turned on, and the verifying terminal nWDO maintains a floating state.

However, in the case that a certain cell is not programmed as the program cell, the NMOS transistor N234 of the third register 230 is not turned on. As a result, the data having a low level initialized to the first node QB (data initialized in case of the program cell) are maintained. Accordingly, the PMOS transistor P230 of the third register 230 is turned on so that the verifying terminal nWDO maintains a high level.

In step S420, a discrimination as to whether or not a corresponding page is programmed may be performed through a voltage level of the verifying terminal nWDO. In the case that the verifying is not finished, the program operation in step S430 is again performed. In the case that the verifying is finished, a verifying operation about the program of the first bit line is performed.

In step S450, it is verified whether or not cells coupled to the first bit line are programmed.

In step S440, the data stored in the first register 210 are transmitted to the third register 230 and then the transmitted data are stored in the third register 230 before perform the verifying operation.

The data are transmitted and then stored through an operation similar to the operation in the step S330. That is, the first couple control means 250 is turned on, and the transistor N218 is turned on. As a result, the data stored in the second node QAb in the first register 210 are transmitted to the sensing node A_SO.

In the embodiment where the first couple control means 240 has the second NMOS transistor N254, an operation of turning on the second NMOS transistor N254 is needed.

In addition, the data identical to the data stored in the first node QA of the first register 210 are stored in the first node QB of the third register 230 by transmitting the read signal READ_L having a high level.

In step S450, it is verified whether or not cells coupled to the first bit line is programmed. The verifying operation is performed by using the third register 230 like an operation in the step S410.

The verifying operation is similar to that in the step S410. However, an operation of turning on the second couple control means 240 is needed so that the voltage of the first bit line is applied to the first sensing node A_SO and the second sensing node B_SO.

In step S460, a discrimination as to whether or not a corresponding page is programmed may be performed through the voltage level of the verifying terminal nWDO. Accordingly, in the case that the verifying is not finished, a program operation is again performed in step S470. In case that the verifying is finished, the verifying operation is finished.

In another example embodiment, in the case that the first register 210 has the PMOS transistor P210 for verifying the program, the step S440 is not performed, but the verifying operation is performed by using the first register 210.

The verifying operation is similar to that in the step S410. However, it is different in that the NMOS transistor N216 is turned on/off in accordance with the voltage level of the first sensing node A_SO and the read signal READ_R is transmitted to the first register 210.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A page buffer in a non-volatile memory device comprising:
    a first register configured to store a first external data and a second external data, and to transfer the second external data to first bit lines;
    a second register configured to store the first external data stored in the first register and to transfer the first external data to second bit lines; and
    a third register configured to store temporarily given data in accordance with a level of the data stored in the first register.

2. The page buffer of claim 1, wherein the first register is coupled to an outside data inputting circuit.

3. The page buffer of claim 1, wherein the second register includes a latch having two inverters and an NMOS transistor coupled between a first node of the latch and a ground voltage, and
    wherein the first node is coupled to a second bit line selecting circuit.

4. The page buffer of claim 1, further comprising:
    a first couple control unit configured to couple the first register and the second register when a first condition is satisfied.

5. The page buffer of claim 4, wherein the first couple control unit includes an NMOS transistor coupled between a second node of the first register and a second node of the second register and turned on in response to a first enable signal.

6. The page buffer of claim 4, wherein the first couple control means includes a first and second NMOS transistors coupled in serial between a second node of the first register and a second node of the second register, and
    wherein the first NMOS transistor is turned on in response to a first enable signal, and the second NMOS transistor is turned on in response to a second enable signal.

7. The page buffer of claim 1, wherein the first register is coupled to the second register.

8. The page buffer of claim 1, further comprising:
    a second couple control unit configured to couple a first sensing node and a second sensing node if a second condition is satisfied,
    wherein the first sensing node corresponds to a node connected to a fist bit line selecting circuit and the first register, and the second sensing node corresponds to a node connected to a second bit line selecting circuit, the second register and the third register.

9. The page buffer of claim 8, wherein the second couple control means includes an NMOS transistor coupled between the first sensing node and the second sensing node and turned on in response to a third enable signal.

10. The page buffer of claim 1, wherein the third register includes a verifying unit for transmitting a verifying signal as to whether or not a specific cell is programmed in accordance with a voltage level of a first node in the third register.

11. The page buffer of claim 1, wherein the first register includes a verifying unit for transmitting a verifying signal as to whether or not a specific cell is programmed in accordance with a voltage level of a first node in the first register.

12. The page buffer of claim 11, wherein the verifying unit includes a PMOS transistor having first and second terminals, and wherein
    a gate terminal of the PMOS transistor is coupled to the first node, the first terminal of the PMOS transistor is coupled to a power supply, and the PMOS transistor transmits the verifying signal through the second terminal.

13. A non-volatile memory device comprising:
    a page buffer configured to have a first register for storing a first external data and a second external data, and transferring the second external data to first bit lines, a second register for storing the first external data stored in the first register and transferring the first external data to second bit lines, and a third register for storing temporarily specific data in accordance with a level of the data stored in the first register;

a first bit line selecting circuit configured to couple selectively a given bit line of the first bit lines to the first register; and a second bit line selecting circuit configured to couple selectively a certain bit line of the second bit lines to the second register.

14. The non-volatile memory device of claim 13, wherein the first register is coupled to the second register.

15. The non-volatile memory device of claim 13, wherein the third register includes a verifying unit for transmitting a verifying signal as to whether or not a specific cell is programmed in accordance with a voltage level of a first node in the third register.

16. A method of programming in a non-volatile memory device having a first to third registers for storing temporarily data to be inputted to first bit lines and second bit lines, the method comprising:

receiving data to be inputted to a given bit line of the second bit lines through an outside data inputting circuit and the first register, and storing the received data in the second register;

receiving data to be inputted to a given bit line of the first bit lines through the outside data inputting circuit, and storing the received data in the first register;

transmitting the data in the first register to a specific bit line of the first bit lines, and transmitting the data in the second register to a specific bit line of the second bit lines; and programming pages in accordance with the data transmitted to the specific bit line.

17. The method of claim 16, wherein the step of storing the data in the first register and the second register includes transmitting the data in the first register to the third register, and storing the transmitted data in the third register, wherein the programming step programs all cells associated with the pages.

18. The method of claim 16, wherein the step of transmitting the data to the specific bit line includes:

coupling a first sensing node to a second sensing node, and precharging the sensing nodes to high level;

disconnecting the first sensing node from the second sensing node; and transmitting the data in the first register to the first sensing node, and transmitting the data in the second register to the second sensing node.

19. The method of claim 16, wherein the step of programming includes:

verifying whether or not cells coupled to the second bit line are programmed on the basis of data in the third register;

storing the data in the first register to be transmitted to a specific bit line of the first bit lines in the third register after the verifying is finished; and verifying whether or not cells coupled to the first bit line are programmed on the basis of the data in the third register.

20. The method of claim 19, wherein the step of the verifying whether or not cells coupled to the first bit line are programmed includes turning on a second couple control unit so that a voltage of the first bit line is applied to the second sensing node.

21. The method of claim 16, wherein the step of programming includes:

verifying whether or not cells coupled to the second bit line are programmed on the basis of the data in the third register; and verifying whether or not cells coupled to the first bit line are programmed on the basis of the data in the first register after the verifying is finished.

* * * * *